(12) United States Patent
Khadour et al.

(10) Patent No.: US 10,697,807 B2
(45) Date of Patent: Jun. 30, 2020

(54) MEASUREMENT SYSTEM AND TEMPERATURE AND/OR SHAPE CHANGE SENSOR USING BRILLOUIN SCATTERING ANALYSIS

(71) Applicants: INSTITUT FRANCAIS DES SCIENCES ET TECHNOLOGIES DES TRANSPORTS, DE L'AMENAGEMENT ET DES RESEAUX, Champs sur Marne (FR); CENTRE NATIONAL DE LA RECHERCHE SCIENTIFIQUE, Paris (FR)

(72) Inventors: Aghiad Khadour, Draveil (FR); Jean-Louis Oudar, Chatenay Malabry (FR)

(73) Assignees: INSTITUT FRANCAIS DES SCIENCES ET TECHNOLOGIES DES TRANSPORTS, DE L'AMENAGEMENT ET DES RESEAUX, Champs sur Marne (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 107 days.

(21) Appl. No.: 15/762,355

(22) PCT Filed: Sep. 21, 2016

(86) PCT No.: PCT/FR2016/052393
§ 371 (c)(1),
(2) Date: Mar. 22, 2018

(87) PCT Pub. No.: WO2017/051119
PCT Pub. Date: Mar. 30, 2017

(65) Prior Publication Data
US 2019/0072417 A1 Mar. 7, 2019

(30) Foreign Application Priority Data

Sep. 22, 2015 (FR) ...................................... 15 58913

(51) Int. Cl.
*G01N 21/00* (2006.01)
*G01D 5/353* (2006.01)
(Continued)

(52) U.S. Cl.
CPC ......... *G01D 5/35364* (2013.01); *G01K 11/32* (2013.01); *G01L 1/242* (2013.01);
(Continued)

(58) Field of Classification Search
CPC ............... G01D 5/35364; G01K 11/32; G01K 2011/322; G01L 1/242; H01S 3/08027;
(Continued)

(56) References Cited

U.S. PATENT DOCUMENTS

2002/0154291 A1* 10/2002 Uchiyama ............ G01M 11/319
356/73.1
2005/0201667 A1* 9/2005 Neta ..................... G02B 6/4232
385/14

(Continued)

OTHER PUBLICATIONS

International Search Report and Written Opinion issued in International Application No. PCT/FR2016/052393 dated Jan. 1, 2017 (8 pages).
(Continued)

Primary Examiner — Sunghee Y Gray
(74) Attorney, Agent, or Firm — Hamre, Schumann, Mueller & Larson, P.C.

(57) ABSTRACT

A measurement system for performing measurement by Brillouin scattering analysis, the system comprising a laser emitter device (10) configured to emit an incident wave (v0) and a reference wave (v0–vB), the incident wave presenting an incident frequency (v0) and the reference wave present-
(Continued)

ing a reference frequency ($v0-vB$), the reference frequency ($v0-vB$) being shifted from the incident frequency ($v0$) by a predetermined value ($vB$). The system is configured to:
- project the incident wave ($v0$) into the optical fiber (25);
- receive in return a backscattered wave ($v0-vS$);
- generate a composite wave ($v0$-S, 0-B) combining the backscattered wave ($v0-vS$) and the reference wave ($S0-vB$); and
- determine at least one property relating to the fiber by analyzing a Brillouin spectrum of the composite wave ($v0$-S, 0-B).

Advantageously, the incident wave and the reference wave come from a dual-frequency vertical-cavity surface-emitting laser source (12) forming part of the laser emitter device.

10 Claims, 3 Drawing Sheets

(51) Int. Cl.
| | | |
|---|---|---|
| *G01K 11/32* | (2006.01) | |
| *G01L 1/24* | (2006.01) | |
| *H01S 5/14* | (2006.01) | |
| *H01S 5/10* | (2006.01) | |
| *H01S 5/183* | (2006.01) | |
| *H01S 3/08* | (2006.01) | |
| *H01S 5/04* | (2006.01) | |

(52) U.S. Cl.
CPC ............ H01S 5/1096 (2013.01); H01S 5/141 (2013.01); *G01K 2011/322* (2013.01); *H01S 3/08027* (2013.01); *H01S 3/08054* (2013.01); *H01S 5/041* (2013.01); *H01S 5/183* (2013.01)

(58) Field of Classification Search
CPC .... H01S 3/08054; H01S 5/041; H01S 5/1096; H01S 5/141; H01S 5/183
USPC .................................................. 356/72–73.1
See application file for complete search history.

(56) References Cited

U.S. PATENT DOCUMENTS

| | | | |
|---|---|---|---|
| 2011/0182544 A1 | 7/2011 | Lee | |
| 2015/0003834 A1 | 1/2015 | Shan et al. | |
| 2017/0067794 A1* | 3/2017 | Matsuura | G01D 5/35364 |
| 2017/0074640 A1* | 3/2017 | Cable | G01B 9/02083 |
| 2017/0108358 A1* | 4/2017 | Bastianini | G01D 5/35303 |

OTHER PUBLICATIONS

Shimizu et al.: "Coherent Self-Heterodyne Brillouin OTDR for Measurement of Brillouin Frequency Shift Distribution in Opitcal Fibers"; Journal of Lightwave Technology, vol. 12, 1994, No. 5, pp. 730-736.

De et al.: "Class-A dual-frequency VECSEL at telecom wavelenght"; Optics Letters, Optical Society of America, vol. 39, No. 19, 2014, pp. 5586-5589.

* cited by examiner

MEASUREMENT SYSTEM AND TEMPERATURE AND/OR SHAPE CHANGE SENSOR USING BRILLOUIN SCATTERING ANALYSIS

FIELD OF THE INVENTION

The invention relates to a measurement system for performing measurement by Brillouin scattering analysis, the system being of the type comprising a laser emitter device configured to emit an incident wave and a reference wave, the incident wave presenting an incident frequency and the reference wave presenting a reference frequency, the reference frequency being shifted from the incident frequency by a predetermined value, the system being configured, when it is connected to at least a first end of an optical fiber:

to project the incident wave into said first end of the fiber;
to receive in return a backscattered wave at the first end of the fiber;
to generate a composite wave combining at least the backscattered wave and the reference wave; and
to determine at least one property relating to the fiber by analyzing a Brillouin spectrum of the composite wave.

The property relating to the fiber that is determined by analyzing the Brillouin spectrum of the composite wave may be any property of the fiber whose variations give rise to variations in (or affect) the Brillouin spectrum of the backscattered wave emitted by the fiber. For example, the temperature to which the fiber is raised, and/or the shape of the fiber (and thus its deformation), are properties of the fiber for which variations give rise to variations in (or affects) the Brillouin spectrum of the backscattered wave.

In known manner, analyzing the Brillouin spectrum of a wave comprises one or more processes serving to determine information as a function of at least one of the so-called "Brillouin" frequency components present in the wave under consideration.

TECHNOLOGICAL BACKGROUND

For several years, measurement systems have been developed that analyze Brillouin scattering of the above-specified type by performing optical heterodyning. Those systems serve in particular to acquire temperature and/or deformation information relating to structures, in particular structures of large dimensions, such as for example civil engineering works.

Under such circumstances, and in known manner, a system of the type set out above is used in connection with an optical fiber arranged in the structure under study. It then enables a wave, referred to as an "incident" wave, to be projected into the optical fiber. By analyzing the backscattered wave that is received in return at the outlet from the fiber, it is possible to determine certain temperatures and/or deformations of the structure under study.

Figure 1:
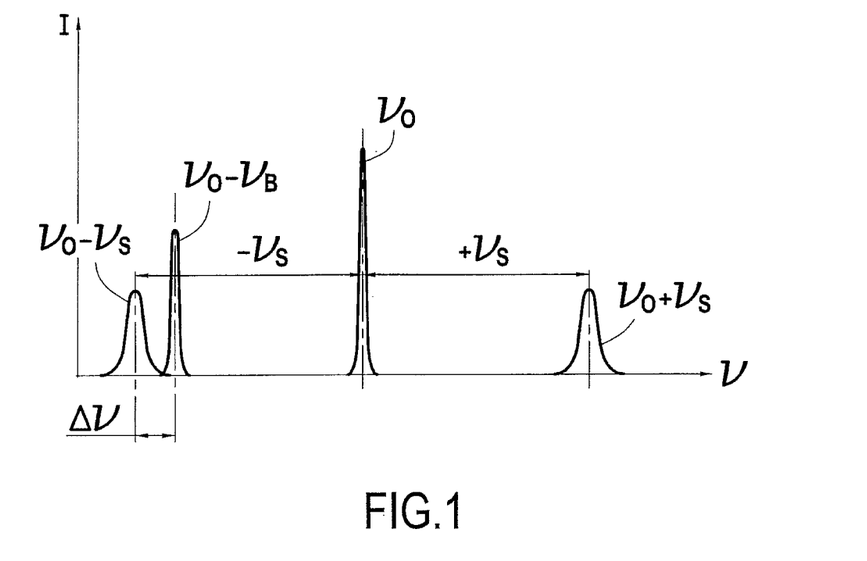
FIG. 1, described above, is a diagram showing variations of intensity as a function of frequency for an incident wave, for Stokes and anti-Stokes components of a backscattered wave, and for a reference wave.

Because of Brillouin scattering, the backscattered wave includes frequency components (referred to as "Brillouin" frequency components) that are shifted relative to the frequency of the incident wave, as shown in FIG. 1. When the incident wave is essentially a monochromatic wave of frequency $\nu 0$, the backscattered wave includes not only the $\nu 0$ component, but at least two frequency components referred to as the Stokes and the anti-Stokes components that are shifted respectively by an offset $+\nu S$ and by an offset $-\nu S$ relative to the frequency $\nu 0$, this offset is referred to as the Brillouin frequency shift.

The optical heterodyning technique consists in mixing the backscattered wave with a reference wave and in analyzing the beat frequency obtained between those two waves.

The frequency $\nu 0-\nu B$ or $\nu 0+\nu B$ of the reference wave ($\nu 0-\nu B$ in FIG. 1) is preferably selected so as to be close to the frequency of one or the other of the Stokes and anti-Stokes components ($\nu 0-\nu S$ or $\nu 0+\nu S$). Consequently, the composite wave obtained by combining the backscattered wave with the reference wave presents beats at a frequency $\Delta\nu$ that is advantageously relatively low. For example, the beat frequency may be situated in a frequency band lower than 1 gigahertz (GHz).

Since the beat frequency is quite low, it can advantageously be measured by using electronic and/or optoelectronic components that are inexpensive and simple to use.

Known measurement systems of the above-specified type can be classified essentially in two families.

In the first family, the incident wave and the reference wave are produced by a single laser source. The frequency shift between these two waves is obtained by a frequency shifter unit, such as for example an acousto-optic modulator. That solution makes it possible to perform optical heterodyning with a reference frequency, but with very low efficiency, since there is no phase relationship between the optical components that make the beats.

In the second family, the incident wave and the reference wave are produced from two distributed feedback (DFB) laser sources.

By way of example, one such system is described in Document US 2015/0003834 A1. Nevertheless, the proposed arrangement having two DFB lasers presents the drawback of complexity and cost that are associated with the presence of two laser sources; it also presents the problem that the proposed coupling for the two DFB lasers is itself also relatively complex, expensive, and leads to large energy losses.

Furthermore, such an arrangement leads to having frequency fluctuations between the waves emitted by the two lasers, and thus to variations in the energy transported by the waves (amplitude noise).

That arrangement thus likewise presents poor performance for making a measurement system that operates by analyzing Brillouin scattering.

SUMMARY OF THE INVENTION

The object of the invention is thus to remedy the drawbacks of the above-described measurement systems and to propose a measurement system making it possible to acquire information by analyzing Brillouin scattering, such as temperature and/or deformation information, which can be exploited over long periods (up to several tens of years), that is not very intrusive, that preferably provides information in real time, that is of low cost, and that relates to one or more structures potentially distributed over long distances (e.g. greater than one kilometer).

This object is achieved by a measurement system of the type presented in the introduction for performing measurements by analyzing Brillouin scattering, wherein the incident wave and the reference wave come from a dual-frequency vertical-cavity surface-emitting laser source. This laser source naturally forms a part of the laser emitter device.

By way of example, such a laser may be of the type described in document Class-A dual-frequency VECSEL at telecom wavelength by Syamsundar et al., Optics Letters Review, Vol. 39, No. 19, Oct. 1, 2014, pp. 5586-5589.

Advantageously, the use of such a source guarantees optical coherence between the incident wave and the reference wave.

The laser source is preferably a continuous source.

In an embodiment, the incident wave is subjected to prior processing before being emitted by the laser emitter device and projected into the optical fiber. By way of example, the processing may consist in emitting the incident wave in the form of time pulses so as to enable a position in the fiber to be measured by optical time domain reflectometry (OTDR).

In similar manner, the reference wave may optionally be subjected to prior processing between being emitted by the laser emitter device and being combined with the backscattered wave.

The invention may be performed over a very wide spectral range.

In a preferred embodiment, the wavelength of the incident wave lies in the range 1.3 micrometers (μm) to 1.8 μm, and preferably in the range 1.5 μm to 1.6 μm. The wavelength of the incident wave may in particular be 1.55 μm. This wavelength corresponds to a frequency shift of about 11 GHz. A wavelength of 1.3 μm corresponds to a frequency shift of about 12 GHz, which is also a frequency at which optical fibers present good transmission characteristics.

When the wavelength of the incident wave lies in the range 1.3 μm to 1.8 μm, the value of the frequency shift (vB) between the incident wave (v0) and the reference wave (v0−vB) preferably has a value lying in the range 10 GHz to 12 GHz. Specifically, when the wavelength of the incident wave is close to 1.55 μm, the Brillouin frequency shift vS between the reference wave v0 and the Stokes and anti-Stokes components v0−vS and v0+vS of the backscattered wave is about 11 GHz.

In an embodiment, the measurement system is configured to perform scattering analysis in "spontaneous Brillouin" mode. In this embodiment, the backscattered wave is a wave backscattered in the fiber as a result of injecting the incident wave independently of any other wave that might be present in the fiber. The incident wave is then projected into the first end of the fiber and the backscattered wave is received from the same first end of the fiber.

Conversely, the measurement system may equally well be configured to perform scattering analysis in "stimulated Brillouin" mode. The measurement system is then configured also to project a second wave into the second end of the fiber. The optical fiber thus passes two contrapropagating waves coming from its two ends; where these two waves meet each other a wave is generated, referred to as the backscattered wave, which wave has the Brillouin spectrum components and it is received at the first end of the fiber (the end where the incident wave is injected into the fiber).

The wave projected into the second end of the fiber may in particular be the reference wave.

In hardware terms, the measurement system may be arranged in various ways.

For acquiring the composite wave and analyzing the signal it conveys, the measurement system may include an optical detector arranged on the path of the composite wave so as to collect the composite wave, and a frequency analyzer configured to analyze the Brillouin spectrum of the composite wave so as to determine said at least one property relating to the fiber.

Furthermore, for obtaining the composite wave from the incident wave and the backscattered wave, the measurement system may include a first optical mixer configured to be placed on the path of the incident wave between the laser emitter device and the first end of the optical fiber.

This first mixer may be an optical circulator or an optical fiber coupler.

The measurement system of the invention may be used in spontaneous Brillouin mode or in stimulated Brillouin mode.

In the first case, the measurement system is configured to project a wave solely into the first end of the fiber.

In this case, in general, the measurement system is configured to project a wave into the fiber only at the first end thereof, and further includes a second optical mixer configured to receive as input respectively the composite wave and the reference wave, and to deliver as output a signal constituted by superposing those two waves.

Furthermore, in this first case, the measurement system may optionally be used without any particular action to modify the polarization of the incident wave emitted by the laser emitter device.

At the output of the laser emitter device, the incident wave has linear polarization, whereas the backscattered wave may have the same polarization or it may have some other polarization.

Thus, in order to improve the performance of the measurement system, one effective technique consists in acting on the polarization of the incident wave in order to increase the amplitude of the Brillouin frequency components in the optical fiber.

Thus, in a preferred embodiment, the measurement system is configured to project a wave solely into the first end of the fiber, and further comprises a polarization controller or polarization scrambler interposed between the laser emitter device and the first optical mixer.

The amplitude of the spontaneous Brillouin frequency components in the optical fiber varies depending on the birefringency state in the optical fiber. The polarization controller or scrambler that changes the polarization of the injected beam is therefore selected in such a manner that the amplitude of the Brillouin frequency components is at a maximum. The polarization controller or scrambler thus advantageously serves to make it easier to measure the property(ies) of the fiber under study.

Furthermore, in order to improve the performance of the measurement system even more, it is also possible to make use likewise of a polarization controller that is arranged on the path of the reference beam, and that is selected so as to increase the sensitivity of the measurement system by increasing the amplitude of the beats between the reference wave and the backscattered wave.

In the second case, that is, when the measurement system is configured to be used in stimulated Brillouin mode, the measurement system is configured to project the reference wave into the second end of the fiber.

In this second case as in the first case, the measurement system may optionally be used without taking any particular action to modify the polarization of the wave(s) emitted by the laser emitter device.

Nevertheless, in order to improve the performance of the measurement system, it is also possible to act on the polarization, both of the incident wave and of the reference wave, in order to increase the amplitude of the Brillouin frequency components in the optical fiber.

Thus, in a preferred embodiment, the measurement system further comprises two polarization controllers interposed respectively on the path of the incident wave between the laser emitter device and the first optical mixer, and on the path of the reference wave between the laser emitter device and the second end of the fiber.

In this embodiment, the amplitudes of the Brillouin frequency components stimulated in the optical fibers depend on the local relative polarization state between the two beams injected into the optical fiber (pump beam-probe beam). That is why installing polarization controllers for both beams makes it possible to increase the amplitude of the Brillouin frequency components so as to make the detection procedure easier.

The invention also provides a temperature and/or deformation sensor comprising at least one measurement system as described above, and at least one optical fiber to which said system is connected, said at least one property determined by the system comprising a temperature and/or a deformation of a portion of the fiber.

The invention also provides the use of a temperature and/or deformation sensor as defined above for measuring a temperature or a deformation of a structure on and/or in which the optical fiber is arranged. By way of example, the structure may be a civil engineering work, an industrial part, a part of a vehicle (airplane wing, . . . ), etc.

One or optionally more optical fibers are then arranged on the surface and/or inside the structure and they are connected to the measurement system of the invention.

By means of these optical fibers placed on or in the structure under consideration, the measurement system then serves to measure the temperature and/or the deformation of the structure.

BRIEF DESCRIPTION OF THE DRAWINGS

The invention can be well understood and its advantages appear better on reading the following detailed description of embodiments given as non-limiting examples. The description refers to the accompanying drawings, in which.

DETAILED DESCRIPTION OF THE INVENTION

Spontaneous Brillouin

Figure 2:
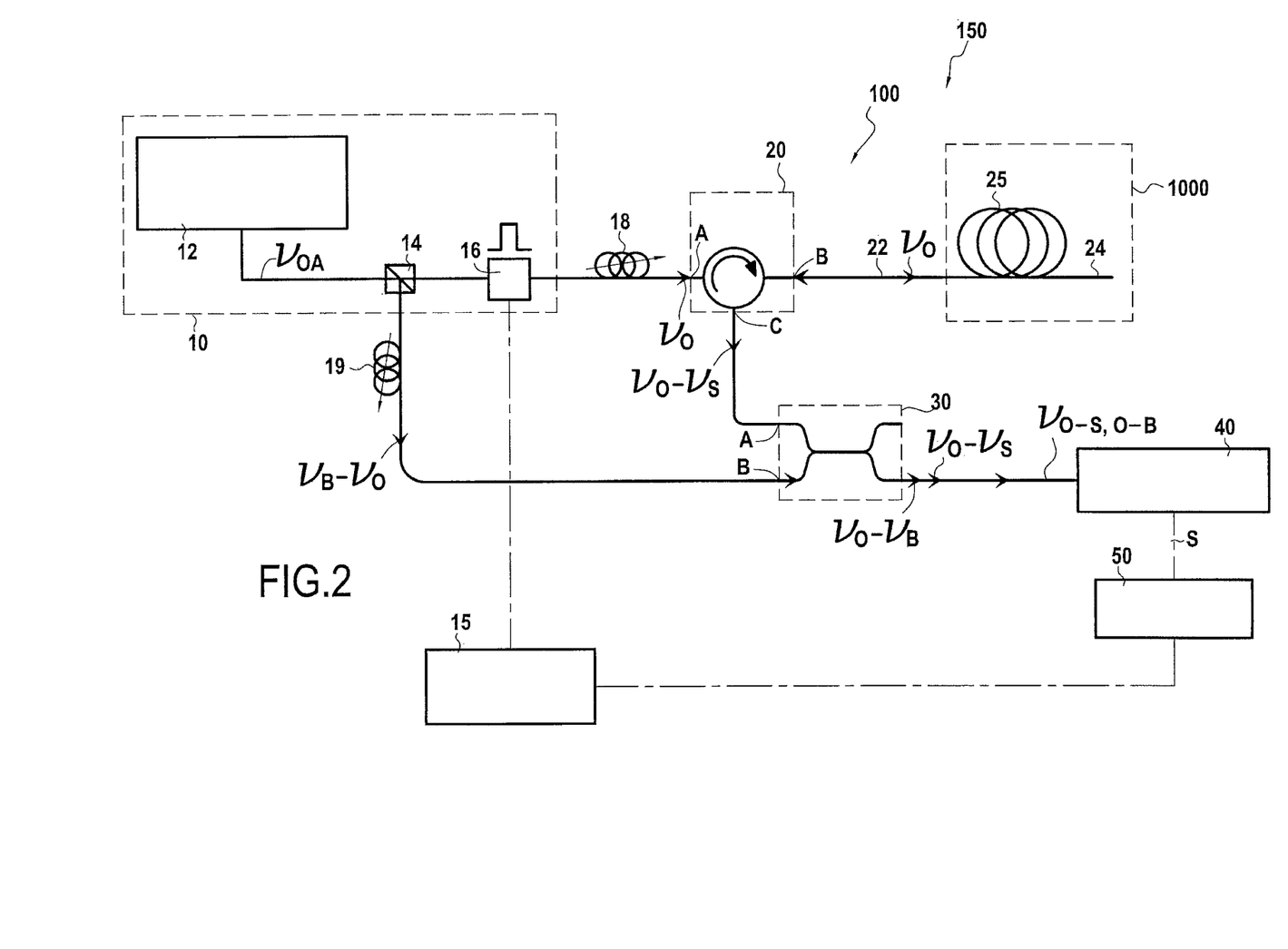
FIG. 2 is a diagrammatic view of a measurement system in a first embodiment of the invention suitable for performing Brillouin scattering analysis of the spontaneous Brillouin type.

With reference to FIG. 2, there follows a description of a measurement system 100 in accordance with the invention for performing Brillouin scattering analysis. In this embodiment, the measurement system 100 is based on the spontaneous Brillouin scattering that occurs spontaneously in a fiber 25 to which the measurement system is connected in response to sending an incident wave ν0.

The measurement system 100 associated with the optical fiber 25 constitutes a temperature and deformation sensor 150 in the meaning of the invention. In the example described, the fiber 25 is placed inside a structure 1000; the sensor 150 thus enables the temperature and the deformation of the structure 1000 to be measured.

The measurement system 100 comprises a laser emitter device 10, a first optical mixer 20, a scrambler or polarization controller 18 and a polarization controller 19 (which are optional), a second optical mixer 30, an optical detector 40, an electronic frequency analyzer 50, and a synchronization system 15.

In the system 100, the laser emitter device 10 is a device serving to produce an incident wave ν0 and a reference wave ν0−νB, which are both substantially monochromatic (for simplification purposes, these waves are referred by the names of their main frequency components, namely in this example ν0 and ν0−νB).

The frequency offset νB between the two waves ν0 and ν0−νB is equal to the Brillouin frequency shift. This Brillouin frequency shift has a fixed value that depends essentially on the wavelength of the incident wave. For a wavelength of 1.55 μm, the Brillouin frequency shift is 11 GHz (for silica-based optical fibers).

The emitter device 10 comprises a laser source 12 configured to emit a primary incident wave ν0A, a beamsplitter cube 14, and an electro-optic modulator 16.

The laser source 12 is a dual-frequency vertical-cavity surface-emitting laser (VECSEL), which is described below with reference to FIG. 4.

The primary incident wave ν0A is a superposition of two waves of different frequencies, namely the incident wave of frequency ν0 (ν0 is the incident frequency), and the reference wave, of frequency ν0−νB (ν0−νB is the reference frequency). The incident wave and the reference wave have different polarizations, and this property is used to separate them. The wavelengths k of the incident wave ν0 and of the reference wave ν0−νB are both about 1.55 μm.

To separate these two waves, a beamsplitter cube 14 is interposed in the beam of the primary incident wave ν0A. It splits this beam into two beams, respectively constituting the incident wave ν0 and the reference wave ν0−νB.

In order to make it possible to determine the distance at which temperature or deformation in the fiber is measured by optical time domain reflectometry (OTDR), the incident wave ν0 is emitted by the laser emitter device 10 in the form of successive pulses.

In order to produce these pulses, the emitter device 10 has an electro-optic modulator 16. This electro-optic modulator 16 is configured to modulate the incident wave ν0 and to deliver it in the form of successive pulses.

The incident wave as produced in this way is initially transmitted to the polarization scrambler or controller 18. This is interposed on the path of the incident wave between the laser emitter device 10 and the first optical mixer 20.

The polarization scrambler or controller 18 serves to modify the polarization state of the incident wave and it needs to be adjusted or selected so as to increase as much as possible the amplitude of the Brillouin frequency component in the optical fiber.

Furthermore, the polarization controller 19 is arranged on the path of the reference beam in order to increase the sensitivity of the measurement system.

The polarization controller 19 serves to modify the polarization state of the reference wave. It is adjusted or selected so as to optimize the efficiency of the coherent detection performed by the optical detector 40 and the electronic frequency analyzer 50.

Specifically, the amplitudes of these Brillouin frequency components stimulated in the optical fibers depends on the local relative polarization state between the two beams injected into the optical fiber: when both polarizations are colinear, the amplitude of the Brillouin frequency component is at a maximum, and consequently Brillouin spectra are easier to detect.

The incident wave ν0 as shaped is transmitted to a first port A of the first mixer 20. The first mixer 20 transmits the wave to a second port B of the first mixer 20, which is connected to a first end 22 of the optical fiber 25 that is to be tested. A fraction of the incident wave ν0 is thus transmitted into the optical fiber 25.

The second end of the optical fiber 25 is referenced 24.

At the first end 22 of the optical fiber 25, the first mixer 20 collects in return, and via its second port B, the wave as backscattered by the optical fiber.

This backscattered wave has various frequency components. In particular, it has the two specific Stokes and anti-Stokes frequency components of the Brillouin spectrum. These components are shifted relative to the frequency of the incident wave ν0 respectively by +νS and by −νS. The exact value of the shift is a function of the temperature of the fiber 25, and also a function of its deformation, and possibly also of other parameters.

In the system 100, the temperature and/or deformation of the fiber is measured by analyzing the "anti-Stokes" component of the backscattered wave. That is why the backscattered wave is written ν0−νS (conventionally, since it includes frequencies other than the frequency ν0−νS, and in particular the frequency ν0+νS).

The backscattered wave ν0−νS is collected by the first mixer 20 and transmitted via a port C of the first mixer to a first port A of the second mixer 30.

The reference wave ν0−νB is also transmitted to a second port B of the second mixer 30.

The second mixer 30 then outputs a composite wave referenced ν0−νS, 0-B, in which the backscattered wave ν0−νS and the reference wave ν0−νB are combined and superposed.

The composite wave ν0-S, 0-B presents beats because of the interference between the backscattered wave ν0−νS and the reference wave ν0−νB.

The composite wave ν0-S, 0-B produced by the second mixer 30 is transmitted to the optical receiver 40. By way of example, this may be a photodiode and it converts the light rays it receives into an electronic signal S of frequency that is the beat frequency of the optical signal it receives.

This electronic signal is transmitted to an electronic frequency analyzer 50. This determines the looked-for information relating to the optical fiber on the basis of the frequency of the anti-Stokes component present in the composite wave transmitted to the optical receiver 40 and consequently present in the electronic signal that it transmits to the frequency analyzer 50.

The analyzer 50 is typically an oscilloscope. It is synchronized on the period of the pulses of the electronic signal so as to present visually the variations in its intensity.

Analyzing the composite wave ν0-S, 0-B (via the signal S) serves to localize spatially in three-dimensional space the events that affect the optical fiber 25 under test. It is thus possible to quantify deformations and/or temperature rises affecting the fiber 25.

In addition, synchronization of the pulses produced by the modulator 16 is ensured by the synchronization system 15. For this purpose, it is connected to the frequency analyzer 50. On the basis of the information from the analyzer 50, it transmits control signals to the modulator 16 in order to control its operation.

The frequency analyzer 50 may include a frequency/voltage converter that converts the frequency into a proportional voltage, and a signal processor computer that determines a temperature and/or a deformation of the fiber on the basis of the voltage produced by the converter.

The computer used for processing the signal may then be used for controlling the synchronization system 15, which controls the emission of laser pulses emitted by the modulator 16.

The first mixer 20 and/or the second mixer 30 may each be in the form of an optical fiber coupler or an optical circulator.

Stimulated Brillouin

Figure 3:
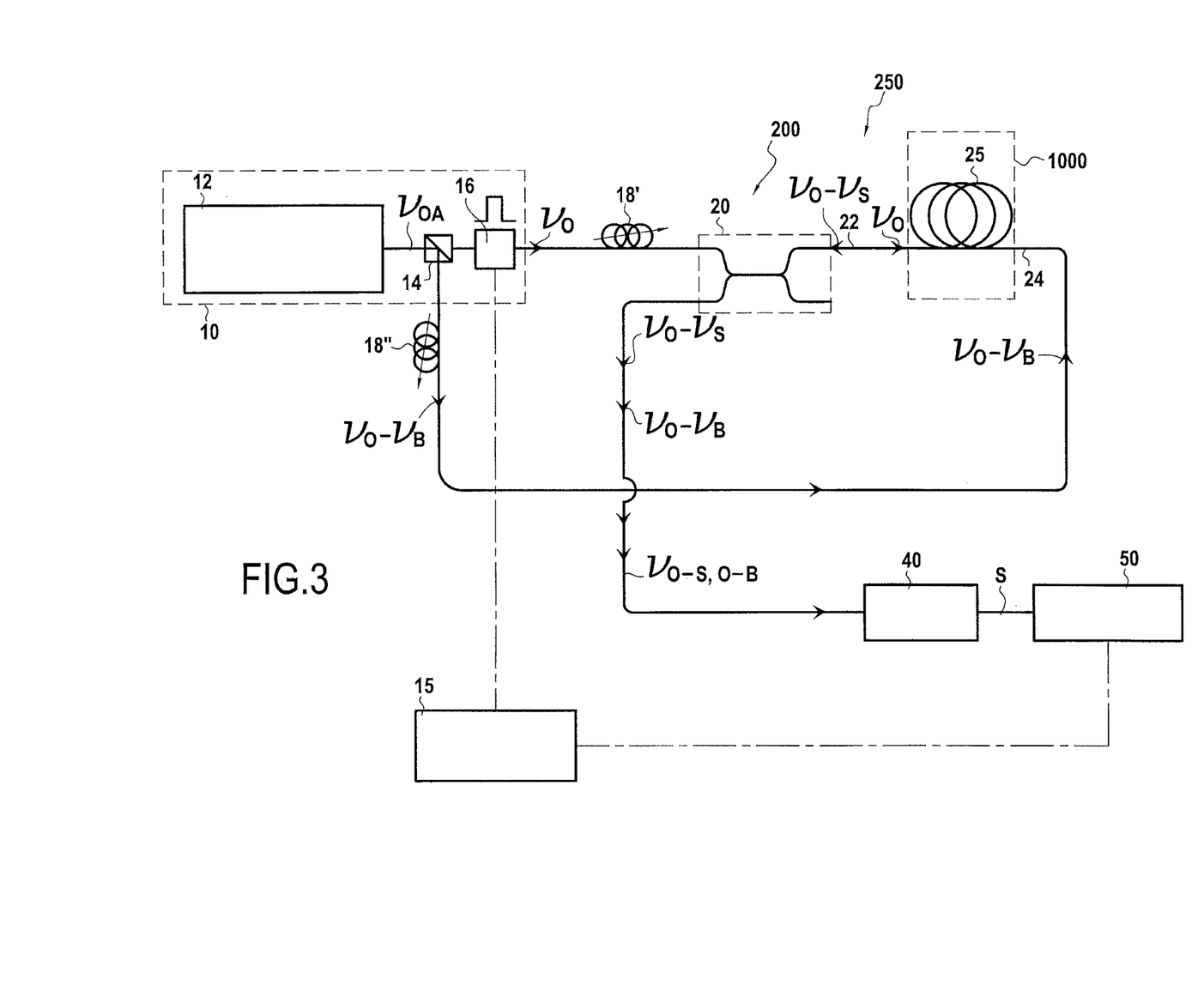
FIG. 3 is a diagrammatic view of a measurement system in a second embodiment of the invention, for performing Brillouin scattering analysis of the stimulated Brillouin type.

With reference to FIG. 3, there follows a description of a measurement system 200 performing Brillouin scattering analysis and corresponding to a second embodiment of the invention.

This measurement system 200 is based on stimulated Brillouin scattering, which takes place in the fiber in response to sending an incident wave, but with the fiber already being used for transmitting the reference wave ν0−νB, the reference wave ν0−νB is projected into the fiber in the opposite direction to the direction to which the incident wave ν0 is projected into the fiber.

The measurement system 200 associated with the optical fiber 25 constitutes a temperature and deformation sensor 250 in the meaning of the invention.

Unless specified to the contrary, the measurement system 200 and the temperature and deformation sensor 250 are identical respectively to the measurement system 100 and to the temperature and deformation sensor 150.

Thus, elements of the measurement system 200 that are identical to or analogous in structure or function with corresponding elements of the measurement system 100 are given the same numerical references.

The measurement system 200 comprises a laser emitter device 10, two polarization controllers 18' and 18" (which are optional), a first optical mixer 20, an optical detector 40, an electronic frequency analyzer 50, and a synchronization system 15.

Unless specified to the contrary, these components are identical to those of the device 100.

The polarization controllers 18' and 18" are interposed firstly on the path of the incident wave between the laser emitter device 10 and the first optical mixer 20, and secondly on the path of the reference wave between the laser emitter device 10 and the second port 24 of the optical fiber 25.

The polarization controllers 18' and 18" serve to modify the polarization states of these two waves (incident wave and reference wave), and they need to be selected or adjusted so as to maximize the amplitude of the Brillouin frequency components stimulated in the optical fiber.

In order to illustrate the fact that the first optical mixer 20 may be either a circulator or else a coupler, the first optical mixer 20 is shown in FIG. 2 as being a circulator, whereas in FIG. 3 it is shown as being a coupler.

The measurement system 200 does not have a second mixer 30 since the backscattered wave ν0−νS is superposed on the reference wave ν0−νB directly in the fiber 25.

Specifically, in this embodiment, the reference wave ν0−νB is injected into the second end 24 of the fiber 25 instead of being injected into one of the ports of a second optical mixer (referenced 30 in the measurement system 100, and not present in the system 200).

Consequently, at the first end 22 of the optical fiber 25, the wave emitted by the fiber is the backscattered wave ν0−νS superposed on the reference wave ν0−νB: this wave thus constitutes the composite wave ν0-S, 0-B described with reference to the above-described measurement system 100.

In the measurement system 100, this composite wave v0-S, 0-B is transmitted to the optical detector 40 for analysis.

Analyzing the Brillouin spectrum of the composite wave v0-S, 0-B serves to determine the looked-for properties of the fiber, namely its deformation and its temperature.

Advantageously, having recourse to optical reflectrometry in the time domain (which is an optional improvement of the invention) makes it possible to determine the position along the fiber 25 that corresponds to the deformation and temperature information as determined in this way.

Figure 4:
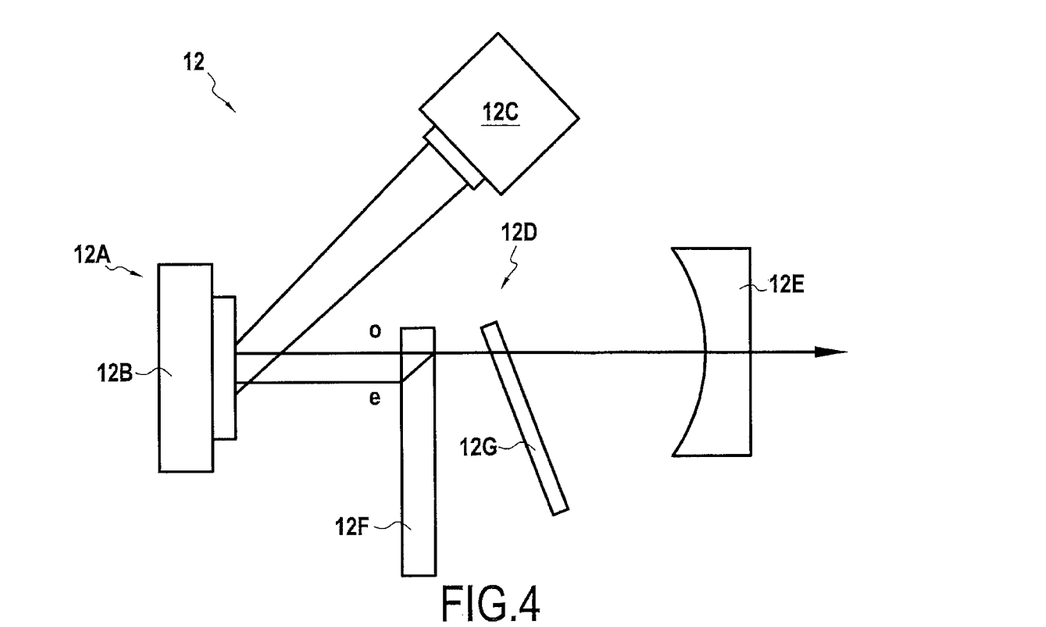
FIG. 4 is a diagram of a laser source suitable for use in a measurement system of the invention.

With reference to FIG. 4, the laser source 12 used in the above-described embodiments is described below.

This source is a laser source constituted by a semiconductor of the vertical-external-cavity surface-emitting laser (VECSEL) type. The specific characteristic of this source is that it serves to emit an output wave constituted mainly by a superposition of two waves that are separated by frequency and that are orthogonally polarized. In the present example, the frequency shift is about 11 GHz.

The source 12 comprises an active semiconductor structure 12A of temperature that is controlled by means of a Peltier device 12B.

Optical pumping is provided by a laser source 12C.

The semiconductor structure 12A is dimensioned to emit a wave having a wavelength equal to 1.55 μm.

The optical cavity 12D of the laser source 12 is arranged between the active structure 12A and a concave dielectric mirror 12E.

Inside the optical cavity 12D, the following two elements are installed:

a birefringent plate 12F. This plate 12F induces an optical path difference and spatial separation between two orthogonally polarized waves, thereby facilitating emission at two frequencies and at two polarizations (an ordinary "o" wave and an extraordinary "e" wave) by reducing coupling between the two modes. The plate 12F may be a birefringent plate made of yttrium vanadate ($YVO_4$); and a Fabry-Perot etalon 12G (constituted by a silica plate): it ensures stable single frequency laser operation for each polarization around the target wavelength (1.55 μm in the embodiment described).

Both waves share the same laser cavity, and they are subjected to the same thermal and mechanical fluctuations, which ensures they are very coherent, thereby making it possible to obtain optical heterodyning very efficient.

The total length of the cavity is determined in such a manner as to ensure a free spectral range greater than 13 GHz.

The laser system has a fiber outlet, i.e. the output from the laser is injected into an optical fiber.

Although the present invention is described with reference to specific embodiments, it is clear that various modifications and changes may be carried out to those embodiments without going beyond the general ambit of the invention as defined by the claims. In addition, individual characteristics mentioned of the various embodiments may be combined in additional embodiments.

Furthermore, there are several similar techniques that can be used for measuring the Brillouin spectrum: Brillouin-OTDR (B-OTDR), Brillouin optimum time domain analyzer (B-OTDA), Brillouin optical coherent domain analyzer (B-OCDA), Brillouin optical frequency domain analyzer (B-OFDA), etc. All of those techniques derive from the optical time domain reflectrometry (OTDR) technique described above. The invention can be embodied regardless of which one of these techniques is used. Consequently, the description and the drawings should be considered in a sense that is illustrative rather than restrictive.

The invention claimed is:

1. A measurement system that performs measurement by Brillouin scattering analysis, the system comprising:
a laser emitter device configured to emit an incident wave and a reference wave, the incident wave presenting an incident frequency and the reference wave presenting a reference frequency, the reference frequency being shifted from the incident frequency by a predetermined value; and
a first optical mixer;
the system being configured to be connected to at least a first end of an optical fiber:
to project the incident wave into said first end of the fiber, with the first optical mixer being placed on a path of the incident wave between the laser emitter device and the first end of the optical fiber;
to receive in return a backscattered wave at the first end of the fiber;
to generate a composite wave combining at least the backscattered wave and the reference wave;
the measurement system further including:
an optical detector arranged on a path of the composite wave so as to collect the composite wave, and
a frequency analyzer configured to determine at least one property relating to the fiber by analyzing a Brillouin spectrum of the composite wave;
the system further including a dual-frequency vertical-cavity surface-emitting laser source forming part of the laser emitter device and configured to emit the incident wave and the reference wave.

2. A measurement system according to claim 1, wherein the wavelength of the incident wave lies in the range 1.3 μm to 1.8 μm.

3. A measurement system according to claim 1, wherein the first optical mixer is an optical circulator or an optical fiber coupler.

4. A measurement system according to claim 1, configured to project a wave solely into the first end of the fiber.

5. A measurement system according to claim 1, configured to project a wave into the fiber only at the first end thereof, and further including a second optical mixer configured to receive as input respectively the composite wave and the reference wave, and to deliver as output a signal constituted by superposing those two waves.

6. A measurement system according to claim 1, configured to project a wave solely into the first end of the fiber, and further comprising a polarization controller or polarization scrambler interposed between the laser emitter device and the first optical mixer.

7. A measurement system according to claim 1, further configured also to project a wave into the second end of the fiber.

8. A measurement system according to claim 7, further comprising two polarization controllers interposed respectively on the path of the incident wave between the laser emitter device and the first optical mixer, and on the path of the reference wave between the laser emitter device and the second end of the fiber.

9. A sensor for sensing at least one of a temperature and a deformation, the sensor comprising at least one measurement system according to claim 1, and at least one optical fiber to which said system is connected, said at least one property determined by the system comprising at least one of a temperature and a deformation of a portion of the fiber.

10. A method of using the sensor according to claim 9 comprising measuring a temperature or a deformation of a structure on or in which the optical fiber is arranged.

\* \* \* \* \*